United States Patent
Muchherla et al.

(10) Patent No.: US 11,610,632 B2
(45) Date of Patent: *Mar. 21, 2023

(54) NAND TEMPERATURE DATA MANAGEMENT

(71) Applicant: Micron Technology, Inc., Boise, ID (US)

(72) Inventors: Kishore Kumar Muchherla, Fremont, CA (US); Sampath Ratnam, San Jose, CA (US); Preston Allen Thomson, Boise, ID (US); Harish Reddy Singidi, Fremont, CA (US); Jung Sheng Hoei, Newark, CA (US); Peter Sean Feeley, Boise, ID (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/331,395

(22) Filed: May 26, 2021

(65) Prior Publication Data
US 2021/0287748 A1  Sep. 16, 2021

Related U.S. Application Data

(63) Continuation of application No. 16/856,955, filed on Apr. 23, 2020, now Pat. No. 11,037,630, which is a
(Continued)

(51) Int. Cl.
*G11C 16/10* (2006.01)
*G11C 16/22* (2006.01)
(Continued)

(52) U.S. Cl.
CPC .......... *G11C 16/10* (2013.01); *G11C 11/5628* (2013.01); *G11C 11/5642* (2013.01);
(Continued)

(58) Field of Classification Search
CPC . G11C 16/10; G11C 16/0483; G11C 16/3418; G11C 16/28; G11C 29/028;
(Continued)

(56) References Cited

U.S. PATENT DOCUMENTS

| 9,640,281 B1 | 5/2017 | Seo et al. |
| 10,354,732 B2 | 7/2019 | Muchherla et al. |

(Continued)

FOREIGN PATENT DOCUMENTS

| CN | 111183483 A | 5/2020 |
| KR | 20120125791 A | 11/2012 |

(Continued)

OTHER PUBLICATIONS

"European Application Serial No. 18852432.6, Response filed Oct. 26, 2020 to Communication pursuant to Rules 161(2) and 162 EPC dated Apr. 14, 2020", 12 pgs.

(Continued)

*Primary Examiner* — Hoai V Ho
*Assistant Examiner* — Minh Dinh
(74) *Attorney, Agent, or Firm* — Schwegman Lundberg & Woessner, P.A.

(57) ABSTRACT

Devices and techniques for NAND temperature data management are disclosed herein. A command to write data to a NAND component in the NAND device is received at a NAND controller of the NAND device. A temperature corresponding to the NAND component is obtained in response to receiving the command. The command is then executed to write data to the NAND component and to write a representation of the temperature. The data is written to a user portion and the representation of the temperature is written to a management portion that is accessible only to the controller and segregated from the user portion.

20 Claims, 9 Drawing Sheets

Related U.S. Application Data continuation of application No. 16/504,039, filed on Jul. 5, 2019, now Pat. No. 10,679,704, which is a continuation of application No. 15/690,920, filed on Aug. 30, 2017, now Pat. No. 10,354,732.

(51) Int. Cl.

| | | |
|---|---|---|
| *G11C 16/04* | (2006.01) | |
| *G11C 16/34* | (2006.01) | |
| *G11C 16/28* | (2006.01) | |
| *G11C 29/02* | (2006.01) | |
| *G11C 16/20* | (2006.01) | |
| *G11C 11/56* | (2006.01) | |

(52) U.S. Cl.
CPC .......... *G11C 16/0483* (2013.01); *G11C 16/20* (2013.01); *G11C 16/22* (2013.01); *G11C 16/28* (2013.01); *G11C 16/3418* (2013.01); *G11C 29/021* (2013.01); *G11C 29/028* (2013.01); *G11C 2211/5641* (2013.01)

(58) Field of Classification Search
CPC ... G11C 16/20; G11C 29/021; G11C 11/5642; G11C 11/5628; G11C 16/22; G11C 2211/5641
USPC ...................................... 365/185.17
See application file for complete search history.

(56) References Cited

U.S. PATENT DOCUMENTS

| | | | |
|---|---|---|---|
| 10,679,704 B2* | 6/2020 | Muchherla | G11C 16/22 |
| 11,037,630 B2* | 6/2021 | Muchherla | G11C 16/3418 |
| 2005/0177673 A1 | 8/2005 | Oberlaender | |
| 2007/0263454 A1* | 11/2007 | Cornwell | G11C 16/26 365/185.24 |
| 2012/0102259 A1 | 4/2012 | Goss et al. | |
| 2012/0224425 A1 | 9/2012 | Fai et al. | |
| 2012/0260349 A1 | 10/2012 | Nagai et al. | |
| 2012/0287711 A1 | 11/2012 | Kim et al. | |
| 2015/0149863 A1 | 5/2015 | Hashimoto | |
| 2015/0340099 A1 | 11/2015 | Kwak | |
| 2016/0117216 A1 | 4/2016 | Muchherla et al. | |
| 2016/0180946 A1 | 6/2016 | Hong | |
| 2017/0255403 A1 | 9/2017 | Sharon et al. | |
| 2017/0285944 A1 | 10/2017 | Wang | |
| 2017/0345510 A1* | 11/2017 | Achtenberg | G06F 11/1048 |
| 2019/0066792 A1 | 2/2019 | Muchherla et al. | |
| 2019/0333585 A1 | 10/2019 | Muchherla et al. | |
| 2020/0258578 A1 | 8/2020 | Muchherla et al. | |

FOREIGN PATENT DOCUMENTS

| | | |
|---|---|---|
| KR | 20150120213 | 10/2015 |
| KR | 20150121562 | 10/2015 |
| WO | WO-2019046370 A1 | 3/2019 |

OTHER PUBLICATIONS

"International Application Serial No. PCT/US2018/048452, International Preliminary Report on Patentability dated Mar. 12, 2020", 8 pgs.

"International Application Serial No. PCT/US2018/048452, international Search Report dated Feb. 1, 2019", 3 pgs.

"International Application Serial No. PCT/US2018/048452, Written Opinion dated Feb. 1, 2019", 6 pgs.

"Korean Application Serial No. 10-2020-7008679, Notice of Preliminary Rejection dated Feb. 23, 2021", w/ English translation, 8 pgs.

"Korean Application Serial No. 10-2020-7008679, Response filed Oct. 12, 2021 to Notice of Preliminary Rejection dated Aug. 10, 2021", w English Claims, 18 pgs.

"European Application Serial No. 18852432.6, Extended European Search Report dated May 26, 2021", 7 pgs.

"Korean Application Serial No. 10-2020-7008679, Response filed Apr. 21, 2021 to Notice of Preliminary Rejection dated Feb. 23, 2021", w English Claims, 17 pgs.

"Korean Application Serial No. 10-2020-7008679, Final Office Action dated Feb. 14, 2022", w English translation, 7 pgs.

"Korean Application Serial No. 10-2020-7008679, Notice of Second Final Rejection dated Apr. 7, 2022", w English Translation, 7 pgs.

"Korean Application Serial No. 10-2020-7008679, Notice of Preliminary Rejection dated Aug. 10, 2021", w English translation, 10 pgs.

"Korean Application Serial No. 10-2020-7008679, Response filed Mar. 16, 2022 to Notice of Second Final Rejection dated Apr. 7, 2022", with English claims, 16 pages.

* cited by examiner

NAND TEMPERATURE DATA MANAGEMENT

PRIORITY APPLICATION

This application is a continuation of U.S. application Ser. No. 16/856,955, filed Apr. 23, 2020, which is a continuation of U.S. application Ser. No. 16/504,039, filed Jul. 5, 2019, now issued as U.S. Pat. No. 10,679,704, which is a continuation of U.S. application Ser. No. 15/690,920, filed Aug. 30, 2017, now issued U.S. Pat. No. 10,354,732, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
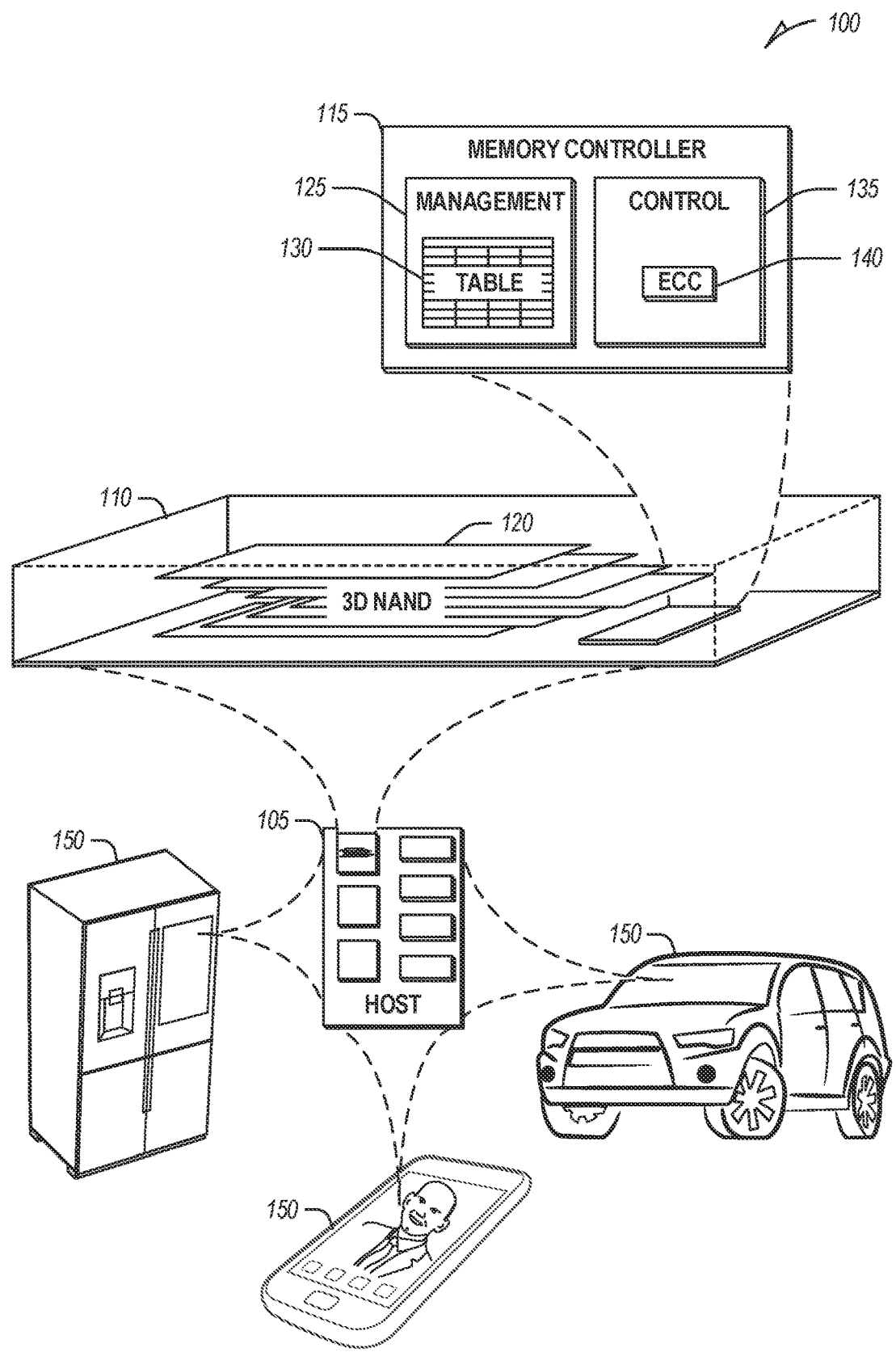
FIG. 1 illustrates an example of an environment including a memory device.

Flash devices work by trapping a charge in a cell (e.g., in a charge trap or floating gate) that then interferes with opening a channel by a control gate. The control gate read voltage is calibrated to be between two trapped charge states. Thus, if the channel opens (e.g., the control gate voltage can override the trapped charge) the cell has one value (e.g., a '1' in a single level cell (SLC)) and a different value if the channel does not open (e.g., a '0' in an SLC). Thus, it is important that the trapped charge is calibrated with the read voltage.

The calibration of the trapped charge and read voltage may be affected by several circumstances. For example, the trapped charge may dissipate overtime. This may be detected and the cell may be refreshed. Refreshes help to preserve data integrity at the cost of wear on the cells themselves. Thus, at system level, flash blocks are refreshed whenever cell voltage margins diminish on a block. The margins could deteriorate due to various combinations of charge gain and charge loss. However, too much refresh activity results in waste of both cell write and erase cycles and processing (e.g., leads to a performance impact for the flash device as resources are used to perform the refresh).

Another issue with the calibration of the trapped charge and the read voltage is temperature. Generally, the threshold voltage of a flash transistor changes with temperatures. NAND controller typically compensates the read voltage based on the ambient temperature. The threshold voltage and the read voltage adjustment may not go hand in hand because there are several million transistors in a NAND package and there may be transistor-to-transistor differences with respect to the threshold voltage movement for temperature. Thus, programming at one temperature and reading at a different temperature tends to exacerbate margins, but the margin loss is temporary (e.g., it is curable by either adjusting the read voltage or by waiting until the read temperature is similar to the write temperature).

To solves these issues—e.g., to minimize unnecessary refreshes due to cross-temperature related high fail bit count scenarios—the write temperature is stored along with the data that was written. In unmanaged flash devices, a host would typically monitor the flash temperatures constantly and include the write temperature in a user data area accessible to the host. Although the write temperature is now stored with the data, this again raises several issues. For example, there is significant signaling overhead in polling the flash components for their temperatures and then re-writing those temperatures back to the flash device. In these cases, the host (e.g., firmware) has to track the temperature in real-time, resulting in addition resource use (e.g., hit on the memory controller of the host).

To address these problems, a NAND controller managed temperature tracking is proposed. The NAND controller writes the temperature information to auxiliary bytes of the flash devices, such as flash cells in a page reserved for controller data (e.g., error correction or other metadata). Because the controller is managing the temperature measurement and writing, the host (e.g., the memory controller or the firmware is not burdened with the temperature reading and writing overhead.

The NAND controller may also use the stored temperature, now accessible to the NAND controller, to manage maintenance procedures. For example, the controller can compare the stored temperature with a current temperature to determine if a write error is due to a bad component (e.g., when the temperatures are within a threshold of each other) or due to a cross-temperature effect (e.g., the write temperature was beyond a threshold higher than a current temperature). If the later case, the controller can refrain from refreshing the block, marking the block bad (e.g., retire the block), etc. In an example, the controller may even use the stored temperature to correct read voltages in order to avoid errors in the first place. In an example, because pages are generally the smallest addressable portion of a flash array, the controller may read each page upon startup, perform error correction to recover the temperature information, and cache the temperature of each block to either correct read voltages or provide the temperature to a host to then correct read voltages. To manage the temperature data for either caching or for storing in a limited number of auxiliary bytes on a page, the controller may quantize the temperature readings. Here, quantizing the temperature readings entails storing a representation of the temperature at a resolution less than the temperature measurement. Thus, the temperature may be binned into five degree increments, or simply labeled, too cold, too hot, and just right. Quantizing may have an added benefit of allowing the temperature data to be more easily read by reducing the number of bits upon which error correction may be needed for an initial read. Additional details and examples are described below.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 900 of FIG. 9.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,684+5208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,684+5208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 524 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
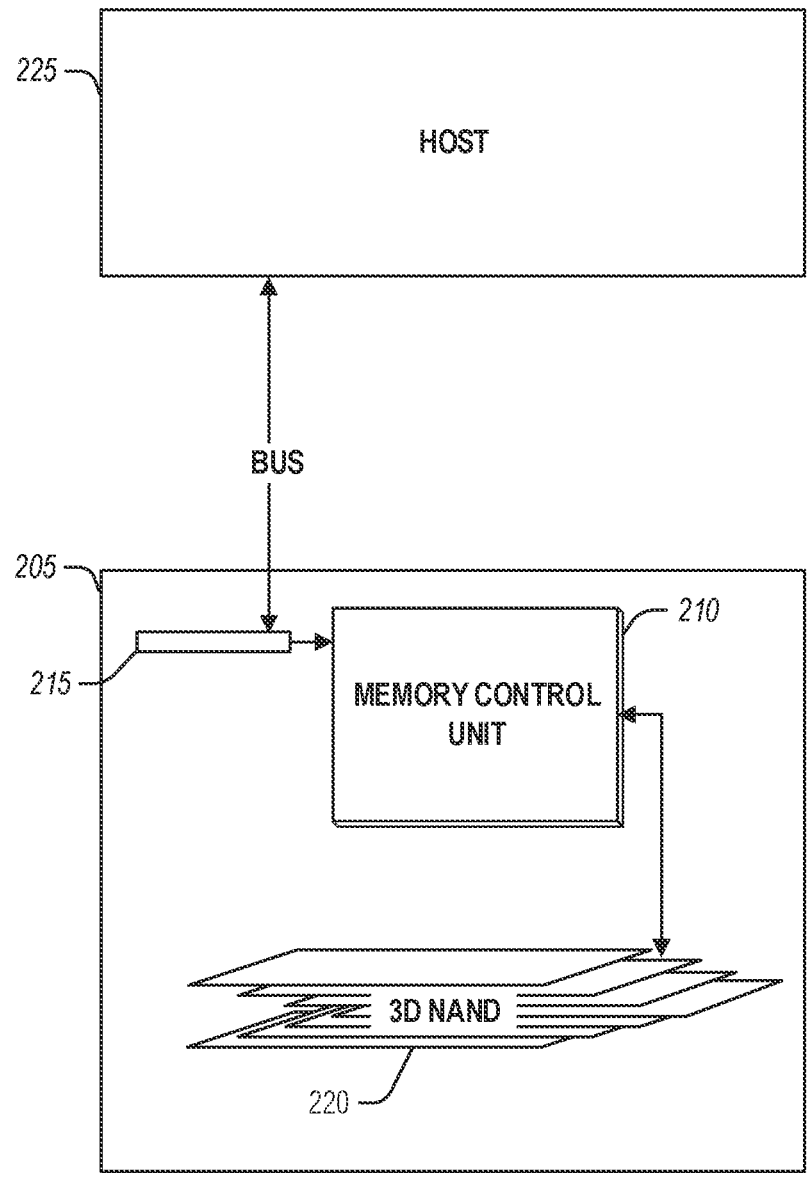
FIG. 2 illustrates an example block diagram of a system for NAND temperature data management.

FIG. 2 illustrates an example block diagram of a system for NAND temperature data management. The system includes a managed memory device 205 (e.g., NAND device, or NAND flash device) connected to a host via an interlink (e.g., bus) when in operation. The managed memory device 205 includes a bus interface 215, a memory control unit 210 (e.g., a controller) and a NAND flash array 220. The controller 210 is arranged to receive a command to write data to a NAND component (e.g., a page in eth array 220) via the interface 215. The controller 210 is arranged to obtain a temperature corresponding to the NAND component in response to receiving the command. Thus, the controller 210 may measure the die temperature corresponding to a page when the write is received, ensuring a contemporaneous temperature measurement with the write. In an example, obtaining the temperature includes obtaining the temperature from a thermometer in response to receiving the command. In an example, obtaining the temperature includes obtaining the temperature from a buffer. In an example, a thermometer periodically measures the temperature and stores the temperature in the buffer. In these last few examples, the controller 210 does not directly poll the thermometer corresponding to the component, but rather uses a last known good reading provided by the thermometer (or the controller 210 or other component during an idle period, for example).

The controller 210 is arranged to execute the command to write data to the NAND component. In addition, the controller 210 also writes a representation of the temperature contemporaneously with the data write. Here, the data is written to a user portion of the NAND device and the representation of the temperature is written to a management portion. Unlike the user portion, the management portion is accessible only to the controller and thus is segregated from the user portion. In an example, the management portion is on the NAND component. In an example, the NAND component is a page. In an example, the management portion is auxiliary bytes of the page.

In an example, the representation of the temperature is a quantization of the temperature at a lower resolution than the obtained temperature. In an example, the quantization is selected from a set of temperature ranges. In an example, the representation of the temperature is an identifier of a member of the set of temperature ranges. Thus, in this last example, the controller 210 may have a map of temperature entries, each with a corresponding index. The representation of the temperature may then be an index corresponding to a map entry (e.g., within a range of temperatures as defined by the map entry). Such an organization may provide for a compact representation of the temperature for complex scenarios. For example, if there is a non-linear correction for temperature ranges (e.g., the cross-temperature problem because worse in a non-linear fashion as write temperatures increase), then entries associated with hotter temperatures may have more narrow ranges while the ranges close to optimal operating temperatures are broad.

The controller 210 is arranged to read the data from the NAND component and is also arranged to read the representation of the temperature when the data is read. In an example, reading the data is in response to a power-on condition of the managed memory device 205. In an example, the representation of the temperature is cached in a volatile memory for future read operations. These examples illustrate a performance improvement that is often used to obtain the read-benefit of storing the temperature with the data. Thus, once read and cached, the temperature may benefit future reads by allowing the read voltage to be calibrated with the cell voltage distributions from the write.

In an example, the data is read in response to receiving a read command at the controller 210. In an example, the representation of the temperature is used to correct a read voltage for the data to reduce read errors. In an example, the representation of the temperature is provided to the host 225 invoking the read command. In an example, the host 225 uses the representation of the temperature to correct the read voltage. In an example, the controller 210 uses the representation of the temperature to correct the read voltage.

The controller 210 is arranged to modify a maintenance operation on the NAND component based on the representation of the temperature stored in the management portion.

In an example, the maintenance operation is a refresh of the NAND component. In an example, modifying the maintenance operation includes adjusting thresholds to perform the refresh based on the representation of the temperature. In this example, the normal voltage margins that would trigger a refresh may be changed to account for the write temperature. This may reduce unnecessary refreshes, saving wear on the cells and reducing processing by the controller 210. In an example, the maintenance operation is a retirement of the NAND component (e.g., marking a block as bad). In an example, modifying the maintenance operation includes adjusting thresholds to perform the retirement based on the representation of the temperature. Again, read errors may be attributed to the cross-temperature condition and ignored or discounted when determining if a block is bad. In an example, the maintenance operation is the read voltage adjustment performed before issuing the read command to the NAND. This can minimize the read errors such that the data can be readily recoverable within a first read attempt.

Figure 3:
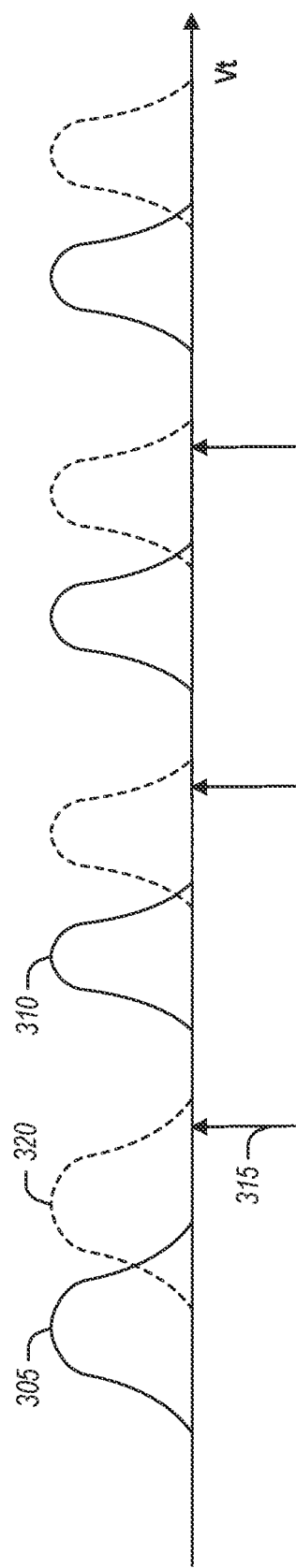
FIG. 3 illustrates an example of cell voltage drift during different temperature writing conditions.

FIG. 3 illustrates an example of cell voltage drift during different temperature writing conditions. For example, Threshold Voltage (Vt) distributions 305 and 310 are two states within a certain write temperature for which the read voltage 315 is calibrated. Thus, if the voltage 315 is applied to the control gate, a cell with a trapped charge within the distribution 305 will have an open channel, and the cell will have a closed channel if the trapped charge is in the distribution 310. The dashed distributions illustrate a cross-temperature result of writing at a high temperature. Here, the initial voltage distribution 320 corresponds to distribution 305, but has crossed the read voltage 315. Thus, application of the read voltage 315 on distribution 320 may result in a closed channel for the cell. This is an error. If, however, the controller were aware of the cross-temperature distributions, the read voltage 315 may be adjusted upwards to again fall between two different distributions.

Figure 4A:
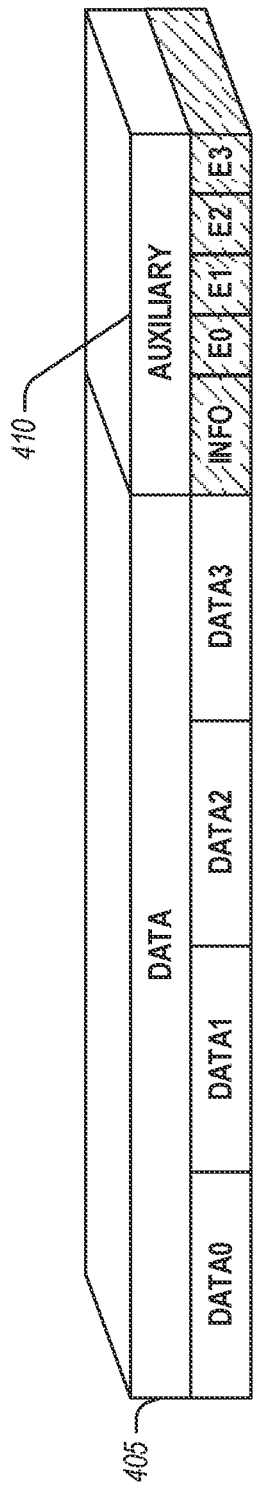
FIGS. 4A-4B illustrate storage configurations for NAND temperature data.
Figure 4B:
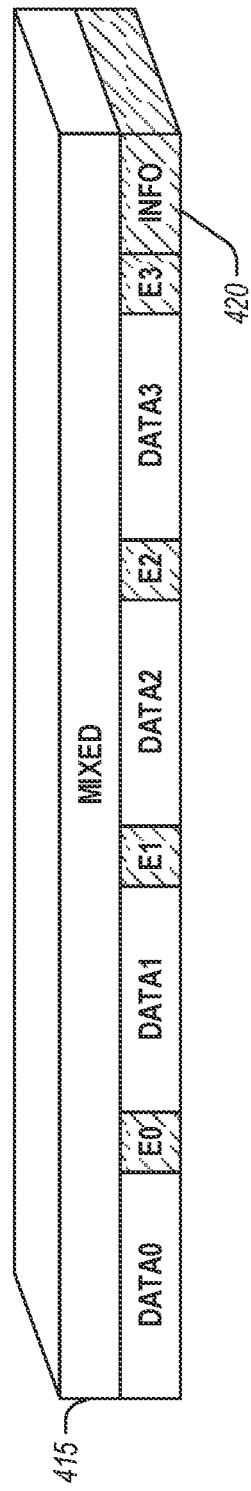

FIGS. 4A-4B illustrate storage configurations for NAND temperature data. FIG. 4A illustrates an organization where a dedicated portion of the page is set-aside for controller metadata. Thus, the page is divided in the user data portion 405 and the auxiliary bytes portion 410. The temperature data may be stored in the auxiliary bytes portion, such as in the segment marked "INFO." In contrast, FIG. 4B illustrates an alternative organization in which the auxiliary bytes are interspersed throughout the use data segments, resulting in a heterogenous portion 415. However, the "INFO" auxiliary bytes 420 are still located on the page and can store the temperature data of the page when it was last written.

Figure 5:
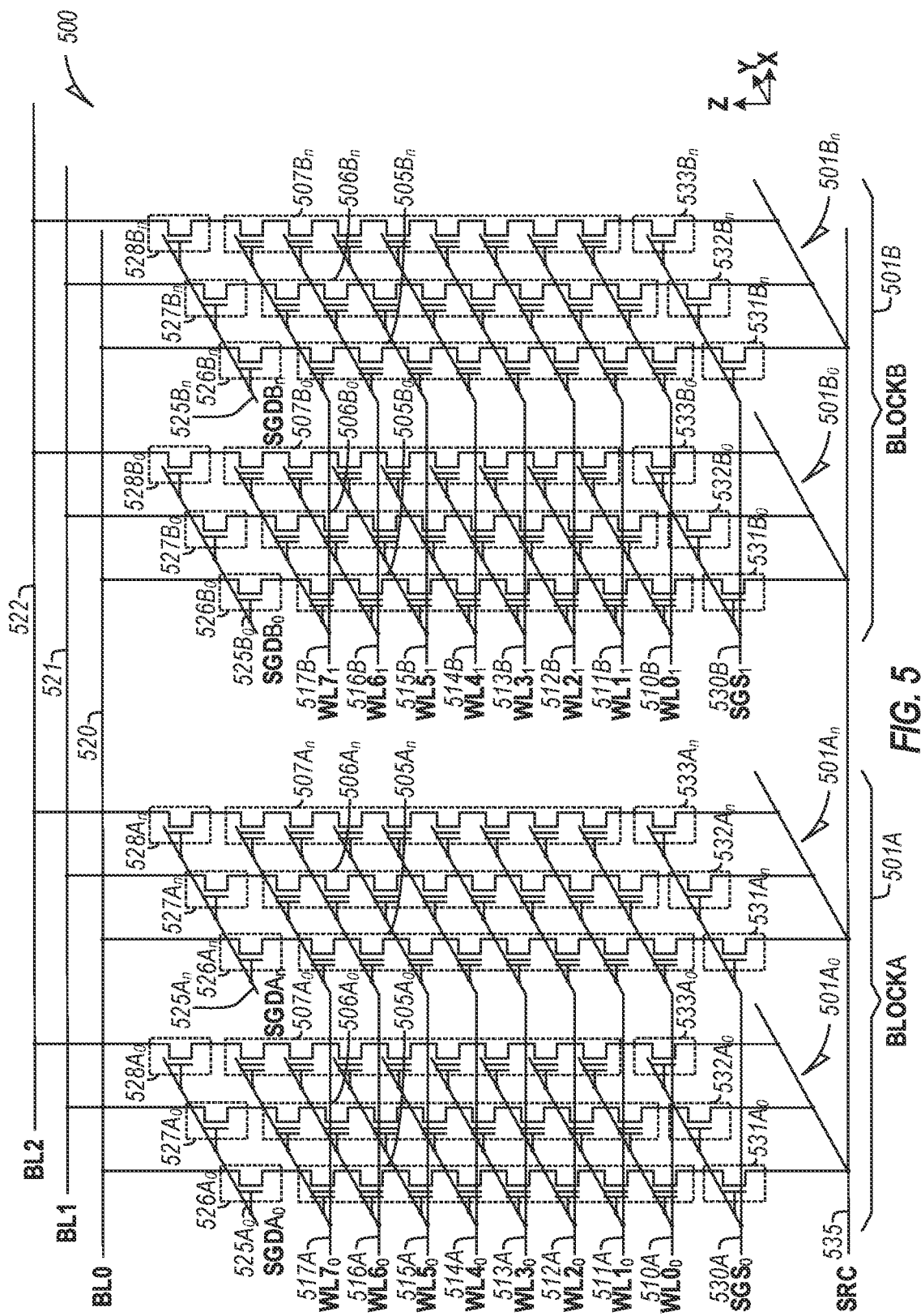
FIGS. 5-6 illustrate schematic diagrams of an example of a 3D NAND architecture semiconductor memory array.

FIG. 5 illustrates an example schematic diagram of a 3D NAND architecture semiconductor memory array 500 including a number of strings of memory cells (e.g., first-third $A_0$ memory strings $505A_0$-$507A_0$, first-third $A_n$ memory strings $505A_n$-$507A_n$, first-third $B_0$ memory strings $505B_0$-$507B_0$, first-third $B_n$ memory strings $505B_n$-$507B_n$, etc.), organized in blocks (e.g., block A 501A, block B 501B, etc.) and sub-blocks (e.g., sub-block $A_0$ $501A_0$, sub-block $A_n$ $501A_n$, sub-block $B_0$ $501B_0$, sub-block $B_n$ $501B_n$, etc.). The memory array 500 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 535 or a source-side select gate (SGS) (e.g., first-third $A_0$ SGS $531A_0$-$533A_0$, first-third $A_n$ SGS $531A_n$-$533A_n$, first-third $B_0$ SGS $531B_0$-$533B_0$, first-third $B_n$ SGS $531B_n$-$533B_n$, etc.) and a drain-side select gate (SGD) (e.g., first-third $A_0$ SGD $526A_0$-$528A_0$, first-third $A_n$ SGD $526A_n$-$528A_n$, first-third $B_0$ SGD $526B_0$-$528B_0$, first-third $B_n$ SGD $526B_n$-$528B_n$, etc.). Each string of memory cells in the 3D memory array can be arranged along the X direction as data lines (e.g., bit lines (BL) BL0-BL2 520-522), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 556, 684, etc.). Although illustrated herein as having two blocks, each block having two sub-blocks, each sub-block having a single physical page, each physical page having three strings of memory cells, and each string having 8 tiers of memory cells, in other examples, the memory array 500 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,684+5208 bytes), 1536 pages per block, 548 blocks per plane, and 4 or more planes per device.

Each memory cell in the memory array 500 includes a control gate (CG) coupled to (e.g., electrically or otherwise operatively connected to) an access line (e.g., word lines (WL) $WL0_0$-$WL7_0$ 510A-517A, $WL0_1$-$WL7_1$ 510B-517B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $526A_0$-$528A_0$ can be accessed using an $A_0$ SGD line $SGDA_0$ $525A_0$, first-third $A_n$ SGD $526A_n$-$528A_n$ can be accessed using an $A_n$ SGD line $SGDA_n$ $525A_n$, first-third $B_0$ SGD $526B_0$-$528B_0$ can be accessed using an $B_0$ SGD line $SGDB_0$ $525B_0$, and first-third $B_n$ SGD $526B_n$-$528B_n$ can be accessed using an $B_n$ SGD line $SGDB_n$ $525B_n$. First-third $A_0$ SGS $531A_0$-$533A_0$ and first-third $A_n$ SGS $531A_n$-$533A_n$ can be accessed using a gate select line $SGS_0$ 530A, and first-third $B_0$ SGS $531B_0$-$533B_0$ and first-third $B_n$ SGS $531B_n$-$533B_n$ can be accessed using a gate select line SGS, 530B.

In an example, the memory array 500 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 6:
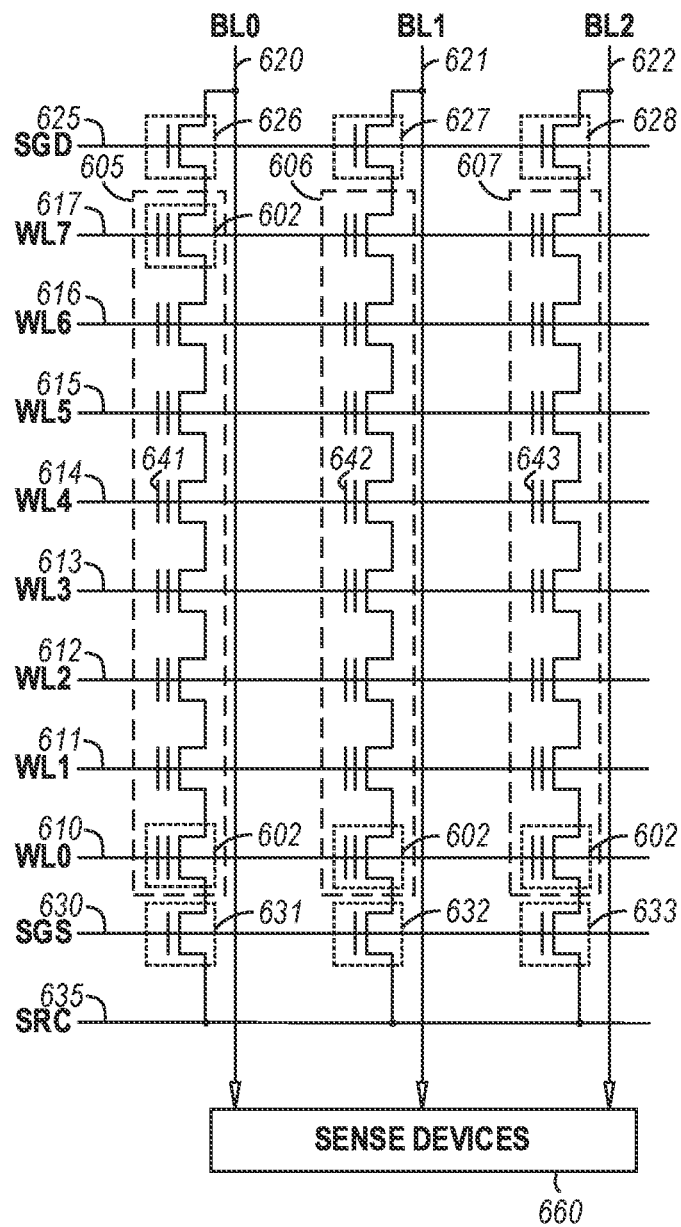

FIG. 6 illustrates an example schematic diagram of a portion of a NAND architecture semiconductor memory array 600 including a plurality of memory cells 602 arranged in a two-dimensional array of strings (e.g., first-third strings 605-607) and tiers (e.g., illustrated as respective word lines (WL) WL0-WL7 610-617, a drain-side select gate (SGD) line 625, a source-side select gate (SGS) line 630, etc.), and sense amplifiers or devices 660. For example, the memory array 600 can illustrate an example schematic diagram of a portion of one physical page of memory cells of a 3D NAND architecture semiconductor memory device, such as illustrated in FIG. 5.

Each string of memory cells is coupled to a source line (SRC) using a respective source-side select gate (SGS) (e.g., first-third SGS 631-633), and to a respective data line (e.g., first-third bit lines (BL) BL0-BL2 620-622) using a respective drain-side select gate (SGD) (e.g., first-third SGD 626-628). Although illustrated with 8 tiers (e.g., using word lines (WL) WL0-WL7 610-617) and three data lines (BL0-BL2 626-628) in the example of FIG. 6, other examples can include strings of memory cells having more or fewer tiers or data lines, as desired.

In a NAND architecture semiconductor memory array, such as the example memory array 600, the state of a selected memory cell 602 can be accessed by sensing a current or voltage variation associated with a particular data line containing the selected memory cell. The memory array 600 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To write (e.g., program) data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 641-643 of the memory cells coupled to WL4). Programming pulses can begin, for example, at or near 15V, and, in certain examples, can increase in magnitude during each programming pulse application. While the write voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied write voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 660, coupled to one or more of the data lines (e.g., first, second, or third bit lines (BL0-BL2) 620-622), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 7:
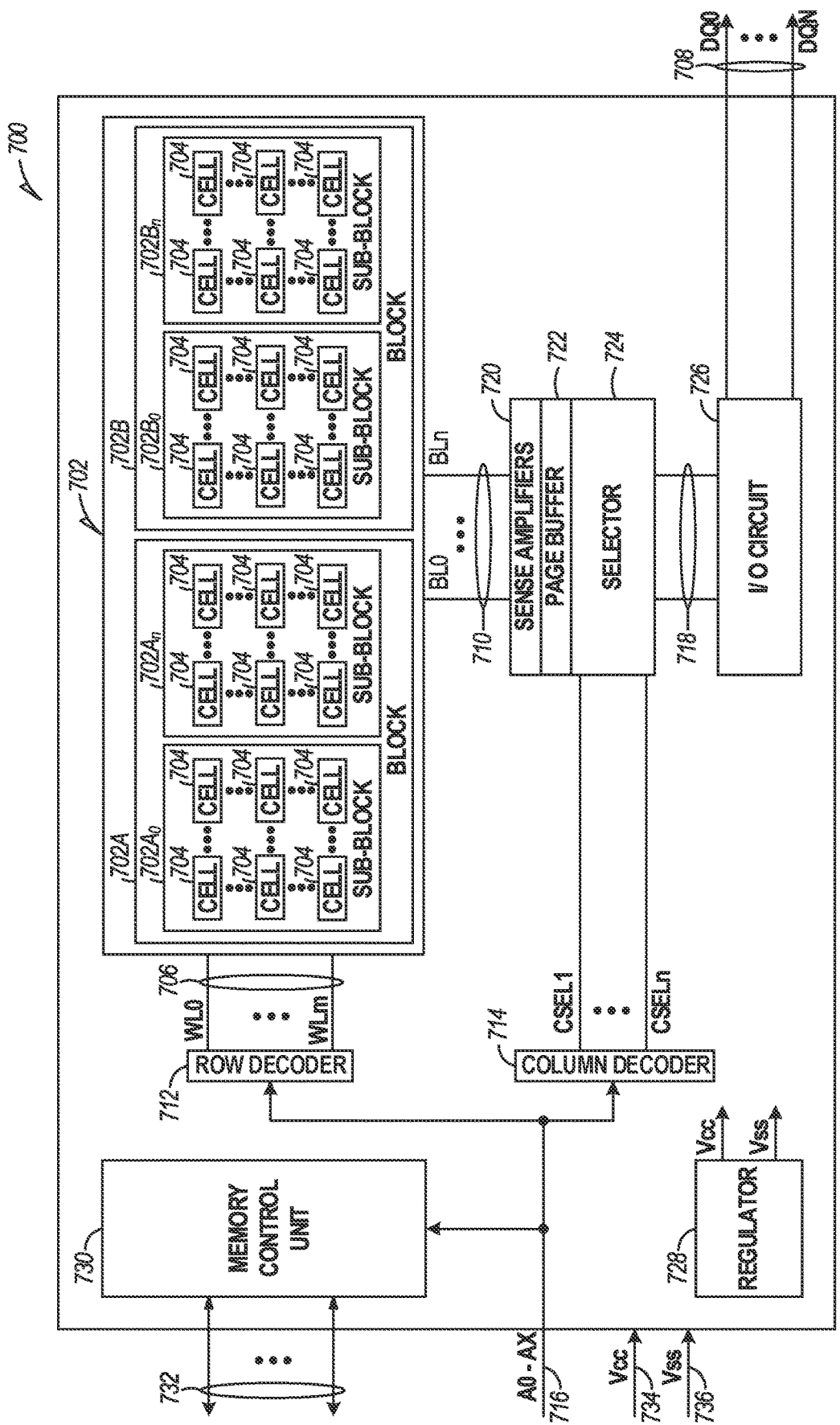
FIG. 7 illustrates an example block diagram of a memory module.

FIG. 7 illustrates an example block diagram of a memory device 700 including a memory array 702 having a plurality of memory cells 704, and one or more circuits or components to provide communication with, or perform one or more memory operations on, the memory array 702. The memory device 700 can include a row decoder 712, a column decoder 714, sense amplifiers 720, a page buffer 722, a selector 724, an input/output (I/O) circuit 726, and a memory control unit 730.

The memory cells 704 of the memory array 702 can be arranged in blocks, such as first and second blocks 702A, 702B. Each block can include sub-blocks. For example, the first block 702A can include first and second sub-blocks 702A$_0$, 702A$_n$, and the second block 702B can include first and second sub-blocks 702B$_0$, 702B$_n$. Each sub-block can include a number of physical pages, each page including a number of memory cells 704. Although illustrated herein as having two blocks, each block having two sub-blocks, and each sub-block having a number of memory cells 704, in other examples, the memory array 702 can include more or fewer blocks, sub-blocks, memory cells, etc. In other examples, the memory cells 704 can be arranged in a number of rows, columns, pages, sub-blocks, blocks, etc., and accessed using, for example, access lines 706, first data lines 710, or one or more select gates, source lines, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on one or more address lines 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells 704, one or more of the sense amplifiers 720 can read a logic level in the selected memory cell 704 in response to a read current flowing in the memory array 702 through the selected string to the data lines 710.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column select signals (CSEL1-CSELn). The selector 724 (e.g., a select circuit) can receive the column select signals (CSEL1-CSELn) and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
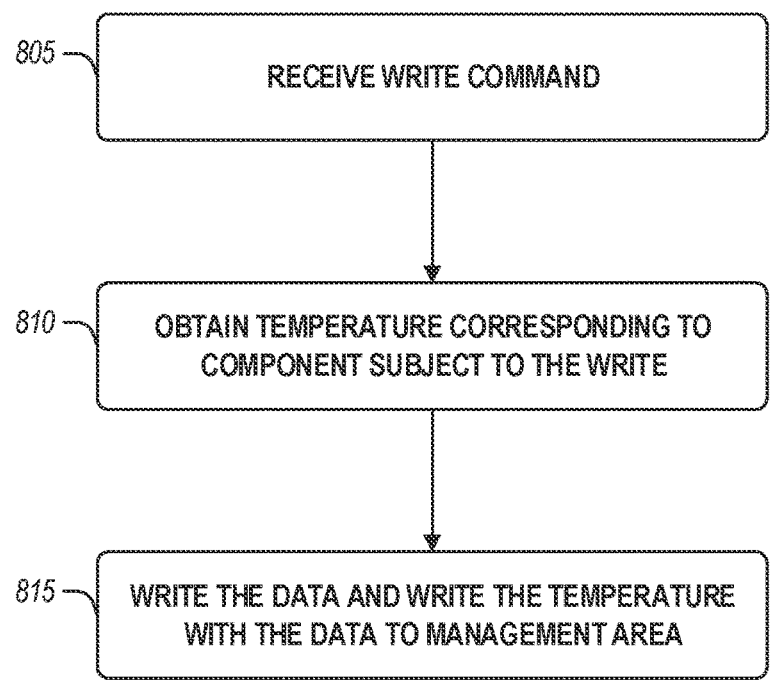
FIG. 8 illustrates a flowchart of a method for NAND temperature data management.

FIG. 8 illustrates a flowchart of a method 800 for NAND temperature data management. The operations of the method 800 are performed by hardware, such as that described above or below (e.g., processing circuitry).

At operation 805, a controller of a NAND device receives a command to write data to a NAND component in the NAND device.

At operation 810, a temperature corresponding to the NAND component is obtained in response to receiving the command. In an example, obtaining the temperature includes obtaining the temperature from a thermometer in response to receiving the command. In an example, obtaining the temperature includes obtaining the temperature from a buffer. In an example, a thermometer periodically measures the temperature and stores the temperature in the buffer.

At operation 815, the command is executed to write data to the NAND component. In addition, a representation of the temperature is also written contemporaneously with the data write. Here, the data is written to a user portion of the NAND device and the representation of the temperature is written to a management portion. Unlike the user portion, the management portion is accessible only to the controller and thus is segregated from the user portion. In an example, the management portion is on the NAND component. In an example, the NAND component is a page. In an example, the management portion is auxiliary bytes of the page.

In an example, the representation of the temperature is a quantization of the temperature at a lower resolution than the obtained temperature. In an example, the quantization is selected from a set of temperature ranges. In an example, the representation of the temperature is an identifier of a member of the set of temperature ranges.

The method 800 may be extended to read the data from the NAND component and also read the representation of the temperature when the data is read. In an example, reading the data is in response to a power-on condition of the NAND device. In an example, the representation of the temperature is cached in a volatile memory for future read operations.

In an example, the data is read in response to receiving a read command at the controller. In an example, the representation of the temperature is used to correct a read voltage for the data to reduce read errors. In an example, the representation of the temperature is provided to a host invoking the read command. In an example, the host uses the representation of the temperature to correct the read voltage.

The method 800 may be extended by modifying a maintenance operation on the NAND component based on the representation of the temperature stored in the management portion. In an example, the maintenance operation is a refresh of the NAND component. In an example, modifying the maintenance operation includes adjusting thresholds to perform the refresh based on the representation of the temperature. In an example, the maintenance operation is a retirement of the NAND component. In an example, modifying the maintenance operation includes adjusting thresholds to perform the retirement based on the representation of the temperature.

Figure 9:
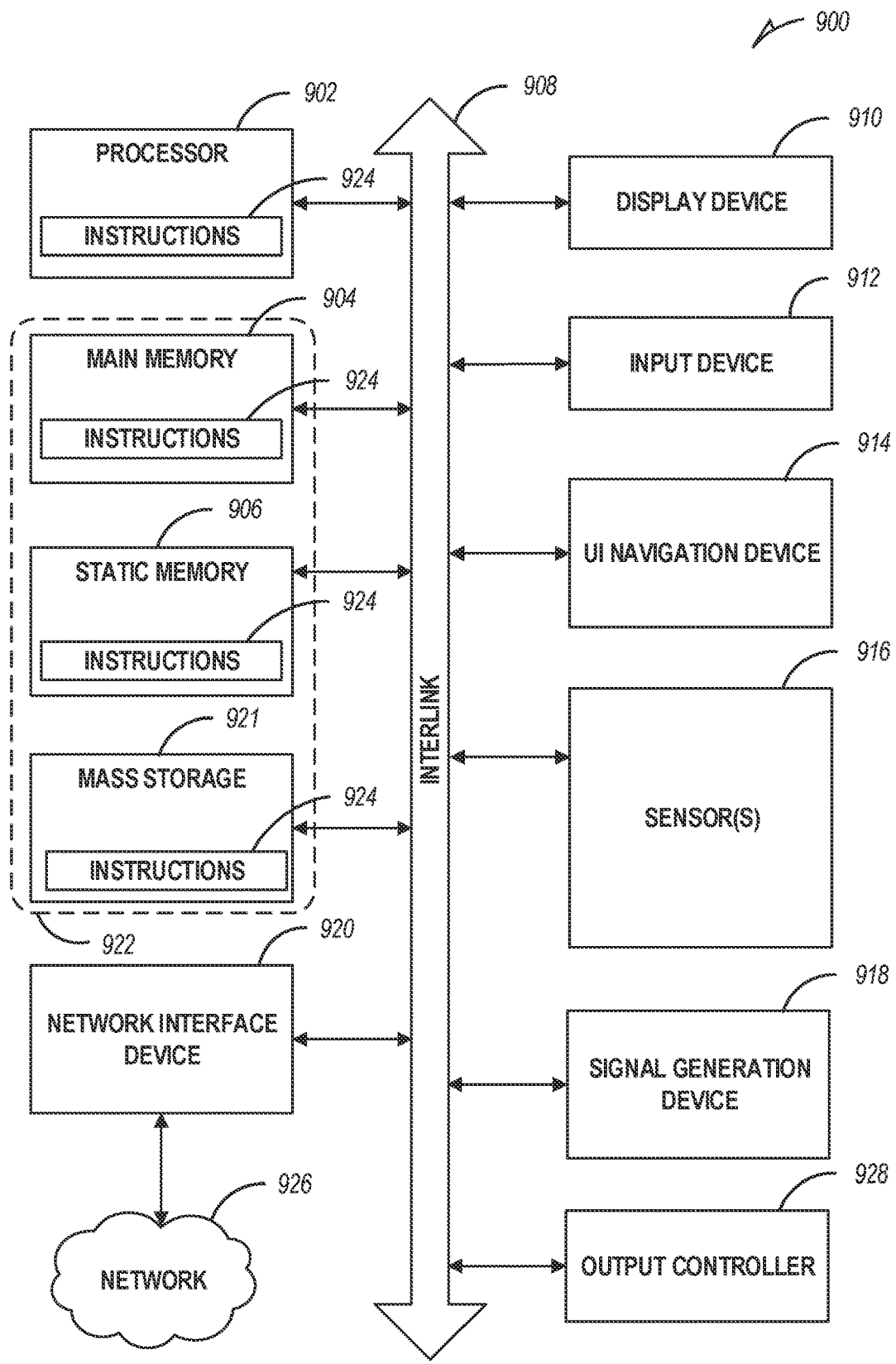
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 900 (e.g., the host device 105, the memory device 110, etc.) may include a hardware processor 902 (e.g., a central processing unit (CPU), a graphics processing unit (GPU), a hardware processor core, or any combination thereof, such as the memory controller 115, etc.), a main memory 904 and a static memory 906, some or all of which may communicate with each other via an interlink (e.g., bus) 908. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 916, a signal generation device 918 (e.g., a speaker), a network interface device 920, and one or more sensors 916, such as a global positioning system (GPS) sensor, compass, accelerometer, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute the machine readable medium 922.

While the machine readable medium 922 is illustrated as a single medium, the term "machine readable medium" may include a single medium or multiple media (e.g., a centralized or distributed database, or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 (e.g., software, programs, an operating system (OS), etc.) or other data are stored on the storage device 921, can be accessed by the memory 904 for use by the processor 902. The memory 904 (e.g., DRAM) is typically fast, but volatile, and thus a different type of storage than the storage device 921 (e.g., an SSD), which is suitable for long-term storage, including while in an "off" condition. The instructions 924 or data in use by a user or the machine 900 are typically loaded in the memory 904 for use by the processor 902. When the memory 904 is full, virtual space from the storage device 921 can be allocated to supplement the memory 904; however, because the storage 921 device is typically slower than the memory 904, and write speeds are typically at least twice as slow as read speeds, use of virtual memory can greatly reduce user experience due to storage device latency (in contrast to the memory 904, e.g., DRAM). Further, use of the storage device 921 for virtual memory can greatly reduce the usable lifespan of the storage device 921.

In contrast to virtual memory, virtual memory compression (e.g., the Linux® kernel feature "ZRAM") uses part of the memory as compressed block storage to avoid paging to the storage device 921. Paging takes place in the compressed block until it is necessary to write such data to the storage device 921. Virtual memory compression increases the usable size of memory 904, while reducing wear on the storage device 921.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 924 may further be transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software.

ADDITIONAL EXAMPLES

Example 1 is a NAND device for NAND temperature data management, the NAND device comprising: a NAND component; and a NAND controller to: receive a command to write data to the NAND component; obtain a temperature corresponding to the NAND component in response to receiving the command; execute the command to write data to the NAND component and to write a representation of the temperature, the data written to a user portion and the representation of the temperature written to a management portion that is accessible only to the NAND controller and segregated from the user portion.

In Example 2, the subject matter of Example 1 includes, wherein the management portion is on the NAND component.

In Example 3, the subject matter of Example 2 includes, wherein the NAND component is a page.

In Example 4, the subject matter of Example 3 includes, wherein the management portion is auxiliary bytes of the page.

In Example 5, the subject matter of Examples 1-4 includes, wherein the representation of the temperature is a quantization of the temperature at a lower resolution than the obtained temperature.

In Example 6, the subject matter of Example 5 includes, wherein the quantization is selected from a set of temperature ranges, and wherein the representation of the temperature is an identifier of a member of the set of temperature ranges.

In Example 7, the subject matter of Examples 1-6 includes, wherein, to obtain the temperature, the NAND controller obtains the temperature from a thermometer in response to receiving the command.

In Example 8, the subject matter of Examples 1-7 includes, wherein, to obtain the temperature, the NAND controller obtains the temperature from a buffer, a thermometer of the device arrange to periodically measure the temperature and store the temperature in the buffer.

In Example 9, the subject matter of Examples 1-8 includes, wherein the NAND controller is further to read the data from the NAND component and reading the representation of the temperature.

In Example 10, the subject matter of Example 9 includes, wherein, the NAND controller reads the data in response to receiving a read command, and wherein the representation of the temperature is used to correct a read voltage for the data to reduce read errors.

In Example 11, the subject matter of Example 10 includes, wherein the representation of the temperature is provided to a host invoking the read command, and wherein the host uses the representation of the temperature to correct the read voltage.

In Example 12, the subject matter of Examples 9-11 includes, wherein the NAND controller reads the data in response to a power-on condition of the NAND device, and wherein the representation of the temperature is cached in a volatile memory for future read operations.

In Example 13, the subject matter of Examples 1-12 includes, wherein the NAND controller is further to modify a maintenance operation on the NAND component based on the representation of the temperature stored in the management portion.

In Example 14, the subject matter of Example 13 includes, wherein the maintenance operation is a refresh of the NAND component, and wherein, to modify the maintenance operation, the NAND controller adjusts thresholds to perform the refresh based on the representation of the temperature.

In Example 15, the subject matter of Examples 13-14 includes, wherein the maintenance operation is a retirement of the NAND component, and wherein, to modify the maintenance operation, the NAND controller adjusts thresholds to perform the retirement based on the representation of the temperature.

Example 16 is a method for NAND temperature data management, the method comprising: receiving, at a controller of a NAND device, a command to write data to a NAND component in the NAND device; obtaining a temperature corresponding to the NAND component in response to receiving the command; executing the command to write data to the NAND component and to write a representation of the temperature, the data written to a user portion and the representation of the temperature written to a management portion that is accessible only to the controller and segregated from the user portion.

In Example 17, the subject matter of Example 16 includes, wherein the management portion is on the NAND component.

In Example 18, the subject matter of Example 17 includes, wherein the NAND component is a page.

In Example 19, the subject matter of Example 18 includes, wherein the management portion is auxiliary bytes of the page.

In Example 20, the subject matter of Examples 16-19 includes, wherein the representation of the temperature is a quantization of the temperature at a lower resolution than the obtained temperature.

In Example 21, the subject matter of Example 20 includes, wherein the quantization is selected from a set of temperature ranges, and wherein the representation of the temperature is an identifier of a member of the set of temperature ranges.

In Example 22, the subject matter of Examples 16-21 includes, wherein obtaining the temperature includes obtaining the temperature from a thermometer in response to receiving the command.

In Example 23, the subject matter of Examples 16-22 includes, wherein obtaining the temperature includes obtaining the temperature from a buffer, a thermometer periodically measuring the temperature and storing the temperature in the buffer.

In Example 24, the subject matter of Examples 16-23 includes, reading the data from the NAND component and reading the representation of the temperature.

In Example 25, the subject matter of Example 24 includes, wherein reading the data is in response to receiving a read command at the controller, and wherein the representation of the temperature is used to correct a read voltage for the data to reduce read errors.

In Example 26, the subject matter of Example 25 includes, wherein the representation of the temperature is provided to a host invoking the read command, and wherein the host uses the representation of the temperature to correct the read voltage.

In Example 27, the subject matter of Examples 24-26 includes, wherein reading the data is in response to a power-on condition of the NAND device, and wherein the representation of the temperature is cached in a volatile memory for future read operations.

In Example 28, the subject matter of Examples 16-27 includes, modifying a maintenance operation on the NAND component based on the representation of the temperature stored in the management portion.

In Example 29, the subject matter of Example 28 includes, wherein the maintenance operation is a refresh of the NAND component, and wherein modifying the maintenance operation includes adjusting thresholds to perform the refresh based on the representation of the temperature.

In Example 30, the subject matter of Examples 28-29 includes, wherein the maintenance operation is a retirement of the NAND component, and wherein modifying the maintenance operation includes adjusting thresholds to perform the retirement based on the representation of the temperature.

Example 31 is at least one machine readable medium including instructions that, when executed by processing circuitry, cause the processing circuitry to perform any method of Examples 16-30.

Example 32 is a system comprising means to perform any method of Examples 16-30.

Example 33 is at least one machine readable medium including instructions that, when executed by processing circuitry, cause the processing circuitry to perform operations comprising: receiving, at a controller of a NAND device, a command to write data to a NAND component in the NAND device; obtaining a temperature corresponding to the NAND component in response to receiving the command; executing the command to write data to the NAND component and to write a representation of the temperature, the data written to a user portion and the representation of the temperature written to a management portion that is accessible only to the controller and segregated from the user portion.

In Example 34, the subject matter of Example 33 includes, wherein the management portion is on the NAND component.

In Example 35, the subject matter of Example 34 includes, wherein the NAND component is a page.

In Example 36, the subject matter of Example 35 includes, wherein the management portion is auxiliary bytes of the page.

In Example 37, the subject matter of Examples 33-36 includes, wherein the representation of the temperature is a quantization of the temperature at a lower resolution than the obtained temperature.

In Example 38, the subject matter of Example 37 includes, wherein the quantization is selected from a set of temperature ranges, and wherein the representation of the temperature is an identifier of a member of the set of temperature ranges.

In Example 39, the subject matter of Examples 33-38 includes, wherein obtaining the temperature includes obtaining the temperature from a thermometer in response to receiving the command.

In Example 40, the subject matter of Examples 33-39 includes, wherein obtaining the temperature includes obtaining the temperature from a buffer, a thermometer periodically measuring the temperature and storing the temperature in the buffer.

In Example 41, the subject matter of Examples 33-40 includes, wherein the operations comprise reading the data from the NAND component and reading the representation of the temperature.

In Example 42, the subject matter of Example 41 includes, wherein reading the data is in response to receiving a read command at the controller, and wherein the representation of the temperature is used to correct a read voltage for the data to reduce read errors.

In Example 43, the subject matter of Example 42 includes, wherein the representation of the temperature is provided to a host invoking the read command, and wherein the host uses the representation of the temperature to correct the read voltage.

In Example 44, the subject matter of Examples 41-43 includes, wherein reading the data is in response to a power-on condition of the NAND device, and wherein the representation of the temperature is cached in a volatile memory for future read operations.

In Example 45, the subject matter of Examples 33-44 includes, wherein the operation comprise modifying a maintenance operation on the NAND component based on the representation of the temperature stored in the management portion.

In Example 46, the subject matter of Example 45 includes, wherein the maintenance operation is a refresh of the NAND component, and wherein modifying the maintenance operation includes adjusting thresholds to perform the refresh based on the representation of the temperature.

In Example 47, the subject matter of Examples 45-46 includes, wherein the maintenance operation is a retirement of the NAND component, and wherein modifying the maintenance operation includes adjusting thresholds to perform the retirement based on the representation of the temperature.

Example 48 is a system for NAND temperature data management, the system comprising: means for receiving, at a controller of a NAND device, a command to write data to a NAND component in the NAND device; means for obtaining a temperature corresponding to the NAND component in response to receiving the command; means for executing the command to write data to the NAND component and to write a representation of the temperature, the data written to a user portion and the representation of the temperature written to a management portion that is accessible only to the controller and segregated from the user portion.

In Example 49, the subject matter of Example 48 includes, wherein the management portion is on the NAND component.

In Example 50, the subject matter of Example 49 includes, wherein the NAND component is a page.

In Example 51, the subject matter of Example 50 includes, wherein the management portion is auxiliary bytes of the page.

In Example 52, the subject matter of Examples 48-51 includes, wherein the representation of the temperature is a quantization of the temperature at a lower resolution than the obtained temperature.

In Example 53, the subject matter of Example 52 includes, wherein the quantization is selected from a set of temperature ranges, and wherein the representation of the temperature is an identifier of a member of the set of temperature ranges.

In Example 54, the subject matter of Examples 48-53 includes, wherein the means for obtaining the temperature include means for obtaining the temperature from a thermometer in response to receiving the command.

In Example 55, the subject matter of Examples 48-54 includes, wherein the means for obtaining the temperature include means for obtaining the temperature from a buffer, a thermometer periodically measuring the temperature and storing the temperature in the buffer.

In Example 56, the subject matter of Examples 48-55 includes, means for reading the data from the NAND component and means for reading the representation of the temperature.

In Example 57, the subject matter of Example 56 includes, wherein the means for reading the data is in response to receiving a read command at the controller, and wherein the representation of the temperature is used to correct a read voltage for the data to reduce read errors.

In Example 58, the subject matter of Example 57 includes, wherein the representation of the temperature is provided to a host invoking the read command, and wherein the host uses the representation of the temperature to correct the read voltage.

In Example 59, the subject matter of Examples 56-58 includes, wherein the reading the data is in response to a power-on condition of the NAND device, and wherein the representation of the temperature is cached in a volatile memory for future read operations.

In Example 60, the subject matter of Examples 48-59 includes, means for modifying a maintenance operation on the NAND component based on the representation of the temperature stored in the management portion.

In Example 61, the subject matter of Example 60 includes, wherein the maintenance operation is a refresh of the NAND component, and wherein the means for modifying the maintenance operation include means for adjusting thresholds to perform the refresh based on the representation of the temperature.

In Example 62, the subject matter of Examples 60-61 includes, wherein the maintenance operation is a retirement of the NAND component, and wherein the means for modifying the maintenance operation include means for adjusting thresholds to perform the retirement based on the representation of the temperature.

Example 63 is at least one machine-readable medium including instructions that, when executed by processing circuitry, cause the processing circuitry to perform operations to implement of any of Examples 1-62.

Example 64 is an apparatus comprising means to implement of any of Examples 1-62.

Example 65 is a system to implement of any of Examples 1-62.

Example 66 is a method to implement of any of Examples 1-62.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
   a plurality of memory components; and
   a controller coupled to the plurality of memory components and including a processor, the processor programmed to perform operations comprising:

measuring, in response to receiving a command, a temperature corresponding to the memory component;

generating a representation of the temperature by quantizing the temperature such that the representation is at a lower resolution than the temperature provided by the measuring;

writing the representation of the temperature to the memory device; and modifying a maintenance operation of the memory component based on the representation of the temperature, the maintenance operation comprising a retirement of the memory component, the modifying the maintenance operation comprising adjusting a threshold to perform the retirement of the memory component based on the representation of the temperature.

2. The memory device of claim 1, wherein the maintenance operation is a first maintenance operation, and wherein the operations comprise:

modifying a second maintenance operation of the memory component based on the representation of the temperature, the maintenance operation comprising a refresh of the memory component.

3. The memory device of claim 2, wherein the modifying the second maintenance operation comprises adjusting a threshold to perform the refresh of the memory component based on the representation of the temperature.

4. The memory device of claim 1, wherein the writing the representation of the temperature to the memory device comprises writing the representation of the temperature to a management portion of the memory device.

5. The memory device of claim 4, wherein the memory component comprises at least one of a page, a block, or a superblock.

6. The memory device of claim 5, wherein the management portion comprises a set of auxiliary bytes of the memory component.

7. The memory device of claim 5, wherein the memory component comprises a set of cells of at least one of a storage class memory, a static random access memory, or a dynamic random access memory.

8. A method comprising:

measuring, in response to receiving a command for a memory device, a temperature corresponding to a memory component in the memory device;

generating a representation of the temperature by quantizing the temperature such that the representation is at a lower resolution than the temperature provided by the measuring;

writing the representation of the temperature to the memory device; and modifying a maintenance operation of the memory component based on the representation of the temperature, the maintenance operation comprising a retirement of the memory component, the modifying the maintenance operation comprising adjusting a threshold to perform the retirement of the memory component based on the representation of the temperature.

9. The method of claim 8, wherein the maintenance operation is a first maintenance operation, and wherein the method comprises:

modifying a second maintenance operation of the memory component based on the representation of the temperature, the maintenance operation comprising a refresh of the memory component.

10. The method of claim 9, wherein the modifying the second maintenance operation comprises adjusting a threshold to perform the refresh of the memory component based on the representation of the temperature.

11. The method of claim 8, wherein the writing the representation of the temperature to the memory device comprises writing the representation of the temperature to a management portion of the memory device.

12. The method of claim 11, wherein the memory component comprises at least one of a page, a block, or a superblock.

13. The method of claim 12, wherein the management portion comprises a set of auxiliary bytes of the memory component.

14. The method of claim 12, wherein the memory component comprises a set of cells of at least one of a storage class memory, a static random access memory, or a dynamic random access memory.

15. A machine-readable medium including instructions that, when executed by processing circuitry, cause the processing circuitry to perform operations comprising:

measuring, in response to receiving a command for a memory device, a temperature corresponding to a memory component in the memory device;

generating a representation of the temperature by quantizing the temperature such that the representation is at a lower resolution than the temperature provided by the measuring;

writing the representation of the temperature to the memory device; and modifying a maintenance operation of the memory component based on the representation of the temperature, the maintenance operation comprising a retirement of the memory component, the modifying the maintenance operation comprising adjusting a threshold to perform the retirement of the memory component based on the representation of the temperature.

16. The machine-readable medium of claim 15, wherein the maintenance operation is a first maintenance operation, and wherein the operations comprise:

modifying a second maintenance operation of the memory component based on the representation of the temperature, the maintenance operation comprising a refresh of the memory component.

17. The machine-readable medium of claim 15, wherein the writing the representation of the temperature to the memory device comprises writing the representation of the temperature to a management portion of the memory device.

18. The machine-readable medium of claim 17, wherein the memory component comprises at least one of a page, a block, or a superblock.

19. The machine-readable medium of claim 18, wherein the management portion comprises a set of auxiliary bytes of the memory component.

20. The machine-readable medium of claim 19, wherein the memory component comprises a set of cells of at least one of a storage class memory, a static random access memory, or a dynamic random access memory.

* * * * *